(12) United States Patent
Guo

(10) Patent No.: US 12,129,858 B2
(45) Date of Patent: Oct. 29, 2024

(54) LIQUID SUCK-BACK SYSTEM AND LIQUID SUCK-BACK METHOD

(71) Applicant: CHANGXIN MEMORY TECHNOLOGIES, INC., Hefei (CN)

(72) Inventor: Yujie Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 276 days.

(21) Appl. No.: 17/659,046

(22) Filed: Apr. 13, 2022

(65) Prior Publication Data

US 2022/0349408 A1 Nov. 3, 2022

(30) Foreign Application Priority Data

Apr. 29, 2021 (CN) .......................... 202110471411.9

(51) Int. Cl.
*F04D 15/02* (2006.01)
*F04D 15/00* (2006.01)
*G01V 8/10* (2006.01)

(52) U.S. Cl.
CPC ..... *F04D 15/0218* (2013.01); *F04D 15/0005* (2013.01); *F04D 15/0077* (2013.01); *G01V 8/10* (2013.01)

(58) Field of Classification Search
USPC .................. 137/565.01, 565.16, 383, 565.23
See application file for complete search history.

(56) References Cited

U.S. PATENT DOCUMENTS

| | | | | |
|---|---|---|---|---|
| 5,527,161 A | * | 6/1996 | Bailey | .................... B01D 35/26 417/302 |
| 5,565,034 A | * | 10/1996 | Nanbu | .............. H01L 21/67265 118/712 |
| 5,985,357 A | * | 11/1999 | Sanada | ................... B05C 11/08 118/712 |

(Continued)

FOREIGN PATENT DOCUMENTS

| | | |
|---|---|---|
| CN | 101566167 A | 10/2009 |
| CN | 102588346 A | 7/2012 |

(Continued)

OTHER PUBLICATIONS

Machine Translation of CN209045505 Wang (Obtained from USPTO Search) (Year: 2024).*

(Continued)

*Primary Examiner* — Bryan M Lettman
*Assistant Examiner* — Geoffrey S Lee
(74) *Attorney, Agent, or Firm* — Syncoda LLC; Feng Ma

(57) ABSTRACT

The present disclosure provides a liquid suck-back system and a liquid suck-back method, and belongs to the technical field of suck-back of liquid. The liquid suck-back system includes a suck-back pipeline and a suck-back pump. The suck-back pipeline includes a first port and a second port, the first port is connected to the suck-back pump, and the second port is connected to a liquid supply pipeline. The suck-back pipeline includes a suck-back valve and a water return bay, the liquid supply pipeline is configured to supply liquid chemicals, and the suck-back pump is configured to suck back residual liquid chemicals in the liquid supply pipeline when the liquid supply pipeline stops supplying liquid chemicals.

11 Claims, 4 Drawing Sheets

(56) References Cited

U.S. PATENT DOCUMENTS

| | | | | |
|---|---|---|---|---|
| 6,062,442 | A | * | 5/2000 | Yang ................ H01L 21/67017 |
| | | | | 118/52 |
| 6,354,474 | B1 | * | 3/2002 | Liu .................. H01L 21/67253 |
| | | | | 118/712 |
| 6,612,505 | B2 | | 9/2003 | Shyu |
| 7,685,963 | B2 | * | 3/2010 | Lee ........................ G03F 7/016 |
| | | | | 118/694 |
| 7,988,429 | B2 | * | 8/2011 | Okumura ............. F04B 43/073 |
| | | | | 222/207 |
| 10,309,428 | B2 | * | 6/2019 | Sakai ................. F04B 43/0081 |
| 2003/0012868 | A1 | * | 1/2003 | Davlin ............... H01L 21/6715 |
| | | | | 427/58 |
| 2007/0254092 | A1 | * | 11/2007 | Lin .................. H01L 21/67288 |
| | | | | 118/712 |
| 2015/0361857 | A1 | * | 12/2015 | Matsuo ................. F01N 3/2066 |
| | | | | 60/303 |

FOREIGN PATENT DOCUMENTS

| | | | |
|---|---|---|---|
| CN | 107842510 A | | 3/2018 |
| CN | 209045505 U | * | 6/2019 |
| CN | 212319415 U | | 1/2021 |
| DE | 29519465 U1 | | 2/1996 |
| JP | 2006313822 A | * | 11/2006 |
| TW | 483047 B | | 4/2002 |

OTHER PUBLICATIONS

Machine Translation of JP2006313822 Akata (Obtained from USPTO Search) (Year: 2024).*

First Office Action cited in CN202110471411.9, mailed May 7, 2022, 7 pages.

* cited by examiner

LIQUID SUCK-BACK SYSTEM AND LIQUID SUCK-BACK METHOD

CROSS-REFERENCE TO RELATED APPLICATION

This disclosure claims the priority of Chinese Patent Application No. 202110471411.9, submitted to the Chinese Intellectual Property Office on Apr. 29, 2021, the disclosure of which is incorporated herein in its entirety by reference.

TECHNICAL FIELD

The present disclosure relates to the technical field of suck-back of liquid, and in particular, to a liquid suck-back system and a liquid suck-back method.

BACKGROUND

After a single-chip washing and etching machine completes an etching task, residual liquid in a liquid supply pipeline needs to be sucked back into a suck-back liquid storage tank. However, after suck-back, there may be residual liquid in the liquid supply pipeline or in a suck-back pipeline. The residual liquid will flow back to a nozzle of the single-chip washing and etching machine along the liquid supply pipeline or the suck-back pipeline, resulting in dripping. This will reduce the yield of the single-chip washing and etching machine, reduce the etching efficiency, and increase the unnecessary production costs.

The information disclosed in the background art is merely intended to facilitate the comprehension to the background art of the present disclosure, and thus may include information that does not constitute the prior art known to those of ordinary skill in the art.

SUMMARY

According to a first aspect of the present disclosure, a liquid suck-back system is provided, including: a suck-back pipeline and a suck-back pump.

The suck-back pipeline includes a first port and a second port, the first port is connected to the suck-back pump, and the second port is connected to a liquid supply pipeline.

The suck-back pipeline includes a suck-back valve and a water return bay, the liquid supply pipeline is configured to supply liquid chemicals, and the suck-back pump is configured to suck back residual liquid chemicals in the liquid supply pipeline when the liquid supply pipeline stops supplying liquid chemicals.

According to a second aspect of the present disclosure, a liquid suck-back method is provided, including:

opening the suck-back valve when the liquid supply pipeline stops supplying the liquid chemicals, and sucking back the residual liquid chemicals in the liquid supply pipeline and the suck-back pipeline by the suck-back pump; and when there are no residual liquid chemicals in the water return bay or when suck-back is abnormal, closing the suck-back valve to stop the suck-back.

BRIEF DESCRIPTION OF THE DRAWINGS

The above and other features and advantages of the present disclosure will become more apparent by describing exemplary implementations thereof in detail with reference to the accompanying drawings.

DETAILED DESCRIPTION

Figure 1:
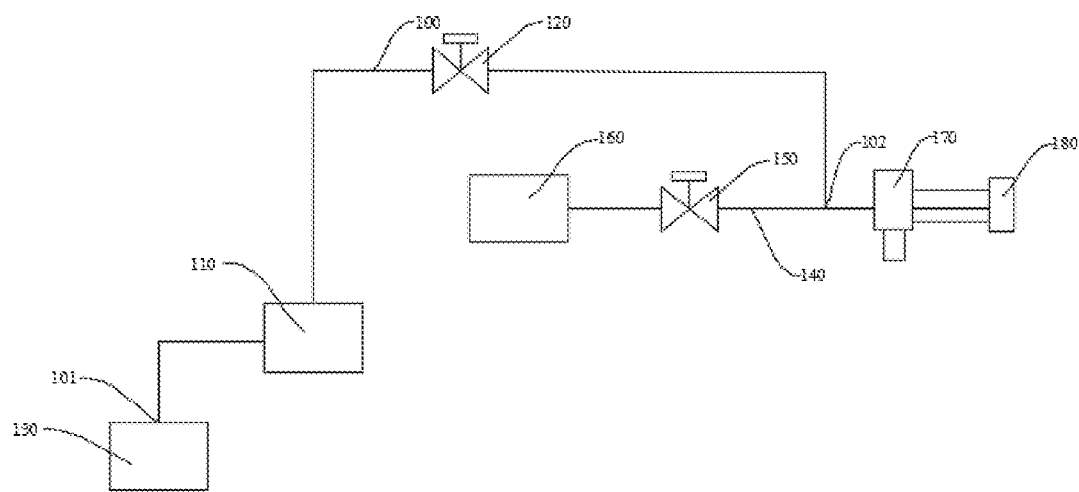
FIG. 1 is a schematic structural diagram of a single-chip washing and etching machine according to an implementation of the present disclosure.

Exemplary embodiments will be described below comprehensively with reference to the accompanying drawings. However, the exemplary embodiments can be implemented in a plurality of forms and should not be construed as being limited to examples described herein. On the contrary, these embodiments are provided such that the present disclosure is more comprehensive and complete, and fully conveys the concept of the exemplary embodiments to persons skilled in the art. The described features, structures, or characteristics may be incorporated into one or more embodiments in any suitable manner. The following description offers many specific details in order for a full understanding of the embodiments of the present disclosure.

When a structure is "on" other structures, it may mean that the structure is integrally formed on other structures, or that the structure is "directly" disposed on other structures, or that the structure is "indirectly" disposed on other structures through another structure.

The terms "one", "a", and "the" are used to indicate the presence of one or more elements/components/and the like; the terms "includes" and "has" are used to indicate an open-ended inclusion and to mean that additional elements/components/and the like may exist in addition to the listed elements/components/and the like. The terms "first" and "second" are used only as markers, not as a restriction on the number of objects.

In the field of chip manufacturing, "lithography" and "etching" are two closely linked steps, which are also very critical steps. The "lithography" process can transfer a pattern on a mask to a photoresist layer on a wafer surface by projection to pattern the photoresist layer. The "etching" process is used to etch one or more film layers that are not covered by the patterned photoresist layer, so as to pattern the one or more film layers.

During wet etching, a single-chip washing and etching machine can be used. In the related art, the single-chip washing and etching machine mainly includes a suck-back pipeline 100, a suck-back pump 110, a suck-back valve 120, a suck-back liquid storage tank 130, a liquid supply pipeline 140, a liquid supply control valve 150, a liquid storage tank 160, a mechanical arm 170, and a nozzle 180. The suck-back pipeline 100 includes a first port 101 and a second port 102. The first port 101 of the suck-back pipeline 100 may be connected to the suck-back liquid storage tank 130, and the suck-back pump 110 may be disposed between the first port 101 of the suck-back pipeline 100 and the suck-back liquid storage tank 130. The second port 102 of the suck-back pipeline 100 may be connected to the liquid supply pipeline 140, and the suck-back valve 120 may be disposed between the first port 101 of the suck-back pipeline 100 and the second port 102 of the suck-back pipeline 100. One port of the liquid supply pipeline 140 may be connected to one end of the liquid supply control valve 150, the liquid storage tank 160 may be connected to the other end of the liquid supply control valve 150, and the other port of the liquid supply pipeline 140 may be connected to the nozzle 180. The mechanical arm 170 may be connected to the nozzle 180, the mechanical arm 170 is configured to drive the nozzle 180 to move along a preset path, and the nozzle 180 can spray liquid. After the single-chip washing and etching machine completes an etching task, residual liquid in the liquid supply pipeline 140 needs to be sucked back into the suck-back liquid storage tank. However, after suck-back, there may be residual liquid in the liquid supply pipeline 140 or in the suck-back pipeline 100. The residual liquid will flow back to the nozzle 180 of the single-chip washing and etching machine along the liquid supply pipeline 140 or the suck-back pipeline 100, resulting in dripping, which will reduce the yield of the single-chip washing and etching machine, reduce the etching efficiency, and increase the unnecessary production costs.

A liquid suck-back system is provided in an implementation of the present disclosure. The liquid suck-back system includes a suck-back pipeline 100 and a suck-back pump 110. The suck-back pipeline 100 includes a first port 101 and a second port 102, the first port 101 is connected to the suck-back pump 110, and the second port 102 is connected to a liquid supply pipeline 140. The suck-back pipeline 100 includes a suck-back valve 120 and a water return bay 190, the liquid supply pipeline 140 is configured to supply liquid chemicals, and the suck-back pump 110 is configured to suck back residual liquid chemicals in the liquid supply pipeline 140 when the liquid supply pipeline 140 stops supplying liquid chemicals.

The suck-back valve 120 is opened during the suck-back operation of etching droplets. The suck-back pump 110 forms a negative pressure in the suck-back pipeline 100, and the liquid in the liquid supply pipeline 140 is sucked into the suck-back pipeline 100 due to the pressure difference. After the suck-back is completed, if there is still residual liquid in the suck-back pipeline 100, due to the arrangement of the water return bay, the residual liquid will stay in the water return bay 190, such that the liquid is not prone to flow back to the nozzle 180 to cause dripping.

Various components of the liquid suck-back system provided in the implementation of the present disclosure are described in detail below with reference to the accompanying drawings.

In an embodiment of the present disclosure, referring to FIG. 1, the liquid suck-back system may further include a controller 210, a sensor 200, a first timer, and a second timer.

Further, the controller 210 is configured to control opening and closing of the suck-back valve 120. The sensor 200 is located outside the water return bay 190, and is connected to the controller 210, and configured to detect an amount of liquid in the water return bay 190 and send a detection signal to the controller 210.

Optionally, the sensor 200 may include an optical sensor 200, and the detection signal may include an optical signal. A duration of the detection signal in a first state may include a duration when an intensity of the optical signal is greater than a preset intensity.

Further, the first timer is connected to the controller 210, and configured to calculate a first duration and send information about the first duration to the controller 210. The first duration includes a suck-back duration when the suck-back valve 120 is in an open state.

Further, the second timer is connected to the controller 210, and configured to calculate a second duration and send information about the second duration to the controller 210. The second duration includes the duration of the detection signal in the first state.

In an embodiment of the present disclosure, the liquid suck-back system may further include a pressure detection device. The pressure detection device is connected to the controller 210, and configured to detect a suck-back pressure in the suck-back pipeline when the suck-back valve 120 is in the open state and send information about the suck-back pressure to the controller 210.

In an embodiment of the present disclosure, the liquid suck-back system may further include an alarm. The alarm is connected to the controller, and configured to issue an alarm prompt message during suck-back abnormality. The alarm prompt message can be sent to a machine, and an alarm prompt light of the machine then issues an alarm. The suck-back abnormality includes the suck-back duration being longer than a first preset duration or the suck-back pressure being out of a preset pressure range. Optionally, the preset pressure range is between 0.15 and 0.3 Mpa.

In an embodiment of the present disclosure, the liquid suck-back system may include a suck-back pipeline 100 and a suck-back pump 110. A first port 101 of the suck-back pipeline 100 may be connected to the suck-back pump 110, and a second port 102 of the suck-back pipeline 100 may be connected to a liquid supply pipeline 140. The suck-back pipeline 100 may further be provided with a suck-back valve 120 and a water return bay 190.

In an embodiment of the present disclosure, the liquid suck-back system may further include a suck-back valve 120. The suck-back valve 120 is configured to open or close the suck-back pipeline 100, so as to adjust and control the liquid in the suck-back pipeline 100. The suck-back valve 120 can receive a control signal and then performs an opening or closing operation in response.

Optionally, the suck-back valve 120 may be controlled in the following forms: manual control, electric control, hydraulic control, pneumatic control, turbine control, electromagnetic control, electromagnetic-hydraulic control, electro-hydraulic control, gas-hydraulic control, spur gear control, and bevel gear drive control.

Figure 2:
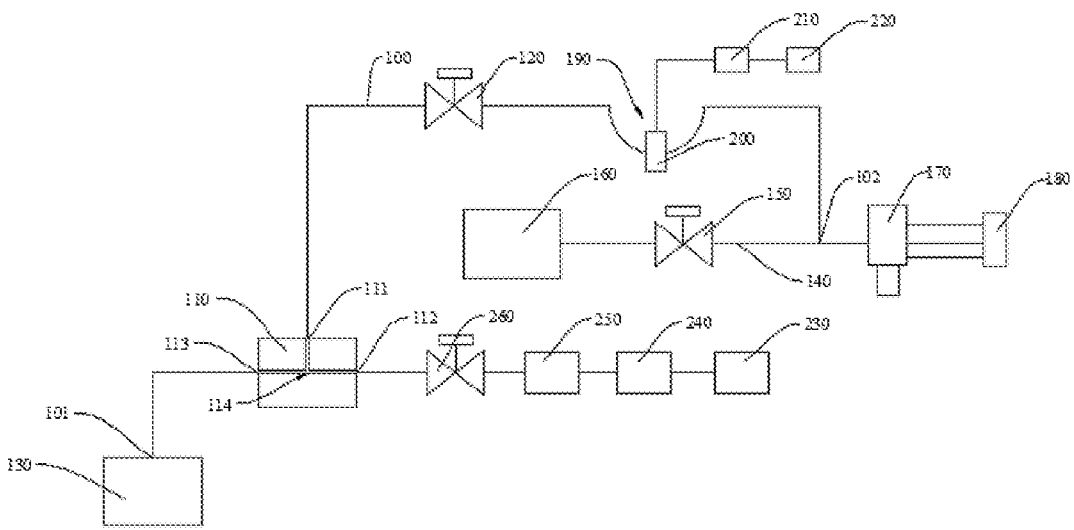
FIG. 2 is a schematic structural diagram of a liquid suck-back system according to an implementation of the present disclosure.

Referring to FIG. 2, the water return bay 190 may be disposed before the suck-back valve 120 or after the suck-back valve 120. The side of the suck-back valve 120 close to the suck-back pump 110 is the front, and the side of the suck-back valve 120 close to the nozzle 180 is the rear. In other words, in an implementation of the present disclosure, the water return bay 190 may be disposed between the suck-back valve 120 and the first port 101 of the suck-back pipeline 100. In another implementation of the present disclosure, the water return bay 190 may also be disposed between the suck-back valve 120 and the second port 102 of the suck-back pipeline 100.

The arrangement of the water return bay 190 can make it possible that after the liquid is sucked back, even if there is residual liquid that is not sucked back, it will stay in the water return bay 190, such that the residual liquid is not prone to flow back to the nozzle 180 to cause dripping. The arrangement of the water return bay 190 can improve the yield of the single-chip washing and etching machine, thereby improving the working efficiency of single-chip washing and etching machine.

Optionally, an elbow of the water return bay 190 has a radius not less than a diameter of the suck-back pipeline 100, so as to avoid excessive liquid flowing back to the nozzle 180 to cause dripping.

In an implementation of the present disclosure, the liquid suck-back system may include a liquid storage tank 160, a liquid supply pipeline 140, and a nozzle 180. One port of the liquid supply pipeline 140 may be connected to one end of the liquid supply control valve 150, the other port of the liquid supply pipeline 140 may be connected to the nozzle 180, and the liquid storage tank 160 may be connected to the other end of the liquid supply control valve 150. The liquid supply control valve 150 is configured to open or close the etching liquid supply pipeline, so as to adjust and control the delivered liquid. The liquid supply control valve 150 can receive a control signal, so as to perform an opening or closing operation in response.

Optionally, the liquid supply control valve 150 may be controlled in the following forms: manual control, electric control, hydraulic control, pneumatic control, turbine control, electromagnetic control, electromagnetic-hydraulic control, electro-hydraulic control, gas-hydraulic control, spur gear control, and bevel gear drive control.

In an exemplary embodiment of the present disclosure, the liquid suck-back system includes a suck-back pump 110 and a fluid supply component 230. The fluid supply component 230 may be connected to the suck-back pump 110 through a feed port 112. A suck-back pump control valve 260, a pressure gage 250, and a pressurizer 240 may further be disposed between the suck-back pump 110 and the fluid supply component 230. The suck-back pump 110 may include the feed port 112, a discharge port 113, and a vacuum port 111. The vacuum port 111 may be connected to the first port 101 of the suck-back pipeline 100, and the discharge port 113 may be connected to the suck-back liquid storage tank 130. A spray chamber 114 may further be disposed between the discharge port 113 of the suck-back pump 110 and the feed port 112 of the suck-back pump 110. The spray chamber 114 has a diameter less than a diameter of the discharge port 113 or the feed port 112. When the material flows in from the feed port 112 at a preset speed, then passes through the spray chamber 114, and finally flows out from the discharge port 113, in this process, the spray chamber 114 forms a smaller pressure relative to the vacuum port 111, such that the liquid can be sucked into the vacuum port 111 faster.

In an implementation of the present disclosure, the feed port 112 in the suck-back pump 110 may also be an air inlet, and the discharge port 113 may also be an air outlet. The vacuum port 111 may be connected to the first port 101 of the suck-back pipeline 100, and the air outlet may be connected to the suck-back liquid storage tank 130. When the liquid is continuously fed into the air inlet, the pressure generated in the suck-back pump 110 is less than the pressure at the vacuum port 111, such that the residual liquid can be sucked back into the suck-back liquid storage tank 130.

In an embodiment of the present disclosure, the fluid supply component 230 may store different types of fluids for continuously feeding the fluid to the feed port 112. The fluid may be a dry and clean gas such as hydrogen, oxygen, and carbon monoxide.

In an embodiment of the present disclosure, the suck-back pump control valve 260 can receive a control signal, so as to perform an opening or closing operation in response to the control signal. Optionally, the suck-back pump control valve 260 can cooperate with different circuits to achieve a preset control target. Different suck-back pump control valves 260 function at different positions in the control system, and may be valves such as check valves, safety valves, and directional control valves.

In an embodiment of the present disclosure, the pressure gage 250 is an instrument that measures fluid pressure. Usually, the measured pressure is compared with a reference pressure (such as an atmospheric pressure or other given pressure), so the relative pressure or pressure difference is measured. For example, the pressure gage 250 may be of a liquid column type, an elastic type, and a sensor type, etc.

In an embodiment of the present disclosure, the pressurizer 240 is a device that stabilizes the fluid output by the fluid supply component at a preset pressure. For example, it can be pressurizer such as switching pressurizers and parameter pressurizers.

In an implementation of the present disclosure, the liquid suck-back system may further include a sensor 200 and a controller 210. The sensor 200 may be disposed at an elbow of the water return bay 190. The sensor 200 can send different detection signals according to the amount of the liquid. The sensor 200 may include a signal generator and a signal detector that cooperate with each other, and the signal generator may generate a signal that changes by interaction with the liquid in the water return bay 190. The signal detector can detect the changed signal, for example, it can detect the intensity of the changed signal, and then generate a detection signal according to the changed signal. The detection signal may be sent to the controller 210. In the present disclosure, after the signal generated by the signal generator interacts with the liquid, the change may be a change in the type of the signal or a change in the intensity of the signal. In some implementations, after the signal generated by the signal generator interacts with the liquid, the change may be a change in the intensity of the signal. In this way, the sensor 200 can generate different control signals according to different amounts of liquid in the water return bay 190, and then send the control signals to the controller 210.

Optionally, the signal generated by the signal generator may be signals such as light, sound waves, and ultrasonic waves. Therefore, different types of sensors 200 can detect the amount of liquid in different ways, and can feed back different detection signals to the controller 210 according to the detection results. For example, it may be sensors such as laser sensors, ultrasonic sensors, and photosensitive sensors.

In an implementation of the present disclosure, the sensor 200 may be a photosensitive sensor, and the photosensitive sensor can transmit an electrical signal as a detection signal to the controller 210 by detecting the amount of the liquid. The optical parameter in the detection signal is used to generate or represent one of luminance or transmittance. It can be understood that the luminance refers to an luminous intensity of an area light source per unit projected area in a certain direction along that direction, also known as a luminous rate. In the International System of Units, the unit of luminance is candela per square meter ($cd/m^2$), also known as nits. The transmittance is a physical term, which indicates the ability of light to pass through the medium, and is the percentage of the luminous flux through a transparent or translucent body to its incident luminous flux. Therefore, more residual liquid in the water return bay 190 indicates lower transmittance or lower luminance, and less liquid indicates higher transmittance or higher luminance. Therefore, the photosensitive sensor is used to detect the liquid existing in the water return bay 190 after etching by the single-chip etching machine, and send the detection signal to the controller 210.

In an implementation of the present disclosure, the controller 210 may send a first control signal and a second control signal to the suck-back valve 120, the suck-back valve 120 can be opened in response to the first control signal, and the suck-back valve 120 can be closed in response to the second control signal.

Further, when the suck-back is started, the controller 210 sends the first control signal to the suck-back valve 120, and the suck-back valve 120 can be opened in response to the first control signal. When the suck-back is ended, the controller 210 sends the second control signal to the suck-back valve 120, and the suck-back valve 120 can be closed in response to the second control signal.

In an implementation of the present disclosure, the controller 210 may send a third control signal to the liquid supply control valve 150, and the liquid supply control valve 150 can be opened in response to the third control signal.

Further, when the suck-back is started, the controller 210 sends the third control signal to the liquid supply control valve 150, and the liquid supply control valve 150 can be closed in response to the third control signal to prevent the liquid outflow from affecting the liquid suck-back.

In an implementation of the present disclosure, the controller 210 may send a fourth control signal and a fifth control signal to the suck-back pump control valve 260, the suck-back pump control valve 260 can be opened in response to the fourth control signal, and the suck-back pump control valve 260 can be closed in response to the fifth control signal.

Further, when the suck-back is started, the controller 210 may send the fourth control signal to the suck-back pump control valve 260, and the suck-back pump control valve 260 can be opened in response to the fourth control signal. When the suck-back is ended, the controller 210 may send the fifth control signal to the suck-back pump control valve 260, and the suck-back pump control valve 260 can be closed in response to the fifth control signal.

In an implementation of the present disclosure, the detection signal sent by the photosensitive sensor is the luminance, and a set value of the luminance is set in the controller 210. The set value is used for comparison with the luminance detected by the photosensitive sensor.

In an implementation of the present disclosure, a specified time is set in the controller 210. The controller 210 can determine whether the liquid suck-back is completed, and if the controller 210 determines that the suck-back is completed within the specified time, the suck-back valve 120 can be closed. If the controller 210 cannot determine that the suck-back is completed until the specified time, it is determined that the suck-back fails.

In an implementation of the present disclosure, the controller 210 can determine whether the liquid suck-back is completed in the duration when the luminance is greater than the set value. If the controller 210 determines that the suck-back is completed in the duration when the luminance is greater than the set value, the suck-back valve 120 can be closed. If the controller 210 cannot determine that the suck-back is completed until the duration, it is determined that the suck-back fails.

Further, the controller 210 is also set with a verification time, and the controller 210 can determine whether the liquid suck-back is completed through the verification time. If the controller 210 determines that the duration when the luminance is greater than the set value is greater than the verification time, the controller 210 determines that the suck-back is completed, and the suck-back valve 120 can be closed.

In an implementation of the present disclosure, during the liquid suck-back operation, the controller 210 may send the first control signal to the suck-back valve 120, and define the moment as an initial moment of the liquid suck-back time. The controller 210 continuously receives the luminance data detected by the photosensitive sensor, and determines the moment when the luminance data sent by the photosensitive sensor is received this time. The suck-back time is determined according to the moment when the controller 210 sends the control signal and the moment when the controller 210 receives the data of the photosensitive sensor this time. The suck-back time is equal to the moment when the controller 210 receives the data of the photosensitive sensor this time minus the moment when the controller 210 sends the control signal. If the controller 210 determines that the suck-back time exceeds the specified time, the controller 210 determines that the suck-back fails. If the controller 210 determines that the suck-back time does not exceed the specified time, the controller 210 determines whether the suck-back is completed. Determining whether the suck-back is completed may include: an initial moment when the luminance is greater than the set value is determined, and whether the duration when the luminance is greater than the set value is greater than the specified time is compared. The controller 210 needs to determine the luminance. Determining the luminance includes: the controller 210 receives current luminance data.

In an implementation of the present disclosure, whether the luminance is greater than the set value is determined. If the controller 210 determines that the luminance is less than the set value, the initial moment of the duration when the luminance is greater than the set value does not exist. For example, in an implementation of the present disclosure, if the controller 210 determines that the luminance is less than the set value, the controller 210 may record the initial moment of the duration T when the luminance is greater than the set value as 0, that is, T=0, so as to indicate that there is no time, and the process that the luminance is greater than the set value has not yet started.

The controller 210 may determine the initial moment when the luminance is greater than the set value by the following method.

The controller 210 continues to receive the luminance data sent by the sensor 200, and determines again whether the luminance is greater than the set value. If the controller 210 determines that the luminance is less than the set value, it maintains the state that the initial moment does not exist, for example, continues to make T=0. If the controller 210 determines that the luminance is not less than the set value and the initial moment is 0, the initial moment is updated to the moment when the controller 210 receives the detection signal of the sensor 200 this time. If the controller 210 determines that the luminance is not less than the set value and the initial moment is not 0, the initial moment is not updated.

If the controller 210 determines that the luminance is greater than the set value, the duration when the luminance is greater than the set value is determined. Then the controller 210 determines whether the duration is greater than the verification time. If the controller 210 determines that the duration is greater than the verification time, the suck-back is completed. The controller 210 sends the first control signal which is used for closing of the suck-back valve 120. If the controller 210 determines that the duration time is less than the verification time, the controller 210 continues to receive the detection signal, continues to determine the suck-back time, and determines whether the suck-back time exceeds the specified time.

In an implementation of the present disclosure, the liquid suck-back system may further include an alarm 220, and the alarm 220 is configured to issue an alarm in response to an alarm signal sent by the controller 210. When the controller 210 determines that the suck-back fails, the controller 210 may send the alarm signal to the alarm 220. The alarm 220 issues an alarm in response to the alarm signal. It is indicated that there is still liquid in the suck-back pipeline 100 at present, such that it is convenient and quick to know whether there is any residual liquid in the suck-back pipeline 100.

In an implementation of the present disclosure, the sensor 200 transmits the detection signal to the controller 210 may be in a wired or wireless mode. For example, wired transmission may be connection to a control unit via a USB interface or the Ethernet. Wireless transmission may be via WIFI or Bluetooth.

Optionally, since the communication between the sensor 200 and the controller 210 requires high stability and anti-interference in the etching process, the signal transmission mode is a wired mode, which is connected through the USB interface or the Ethernet. It can greatly improve the stability and anti-interference of the single-chip washing and etching machine in the working process, thereby improving the etching efficiency.

Optionally, the above controller 210 may also include a programmable logic controller (PLC), a programmable automation controller (PAC), a bus industrial computer, and an embedded controller. It may also be some components or circuits in a central processing unit (CPU).

The liquid suck-back system of the present disclosure will be further described below with an exemplary specific implementation.

In this exemplary implementation, the liquid suck-back system may include a photosensitive sensor, a controller 210, an alarm 220, a liquid supply control valve 150, and a suck-back pump control valve 260. The photosensitive sensor is disposed at the elbow of the water return bay 190, the photosensitive sensor can transmit the detection signal to the controller 210 through a cable, and the controller 210 is connected to the photosensitive sensor through the Ethernet or USB interface. The controller 210 may further include the alarm 220, and the controller 210 and the alarm 220 are connected by a cable.

When the suck-back is started, the controller 210 may send the first control signal, the third control signal, and the fourth control signal. The suck-back valve 120 is opened in response to the first control signal, the liquid supply control valve 150 is closed in response to the third control signal, and the suck-back pump control valve 260 is opened in response to the fourth control signal. The moment when the controller 210 sends the first control signal is defined as a first initial moment of the suck-back time. First, the controller 210 continuously receives the luminance data detected by the photosensitive sensor, and then the controller 210 determines the suck-back time, and determines whether the suck-back time exceeds the specified time. If the controller 210 determines that the suck-back time exceeds the specified time, the controller 210 determines that the suck-back fails. The controller 210 sends an alarm signal to the alarm 220, and the alarm 220 issues an alarm in response to the alarm signal. It is indicated that there is still residual liquid in the suck-back pipeline 100 at present. If the controller 210 determines that the suck-back time does not exceed the specified time, then the controller 210 determines the current luminance and determines whether the current luminance is greater than the set value. If the controller 210 determines that the current luminance is greater than the set value, it determines the duration when the current luminance is greater than the set value. Next, the controller 210 determines whether the duration is greater than the verification time. If the controller 210 determines that the duration is greater than the verification time, the controller 210 determines that the suck-back is completed. The controller 210 sends the second control signal which is used for closing of the suck-back valve 120. The controller 210 sends the fifth control signal to the suck-back pump control valve 260, and the suck-back pump control valve 260 is closed in response to the fifth control signal. If the controller 210 determines that the duration is less than the verification time, the controller 210 continues to receive the detection signal, and continues to repeat the above steps.

Therefore, the photosensitive sensor can be used to monitor whether there is residual liquid in the water return bay after the etching of the single-chip washing and etching machine is completed. In other words, if there is still residual liquid in water return bay 190 and there is a large amount of liquid, then the luminance at the elbow of water return bay 190 is relatively high, and the photosensitive sensor can convert the luminance into an electrical signal, which is transmitted to the controller 210 via a cable. The controller 210 can then send the alarm signal to the alarm 220, and the alarm 220 sends the alarm in response to the alarm signal, indicating that there is still a large amount of liquid in the suck-back pipeline 100 at present. If the liquid in the suck-back pipeline 100 is completely sucked back, the luminance at the elbow of the water return bay 190 will be small. The photosensitive sensor can convert this luminance into an electrical signal, which is transmitted to the controller 210 through a cable. Therefore, through the arrangement of the sensor 200, the controller 210, and the alarm 220, the residual liquid in the water return bay 190 can be monitored in real time, so as to know whether there is any liquid that is not sucked back in the suck-back pipeline 100.

Figure 3:
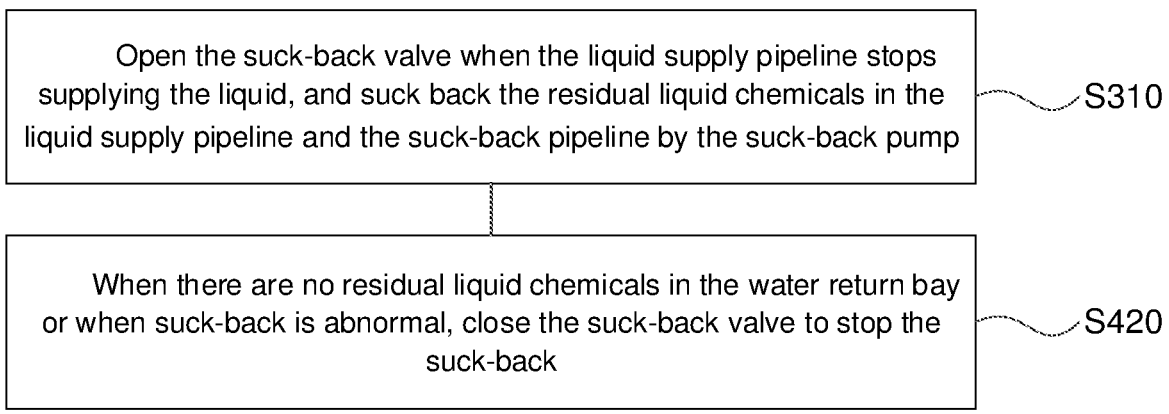
FIG. 3 is a flow chart of a liquid suck-back method according to an implementation of the present disclosure.

The present disclosure provides a liquid suck-back method, which can be applied to any liquid suck-back system. Referring to FIG. 3, the liquid suck-back method includes the following steps.

Step S310, the suck-back valve 120 can be opened when the liquid supply pipeline 140 stops supplying the liquid chemicals, and the residual liquid chemicals in the liquid supply pipeline 140 and the suck-back pipeline 100 is sucked back by the suck-back pump 110.

Step S420, when there are no residual liquid chemicals in the water return bay 190 or when suck-back is abnormal, the suck-back valve 120 is closed to stop the suck-back.

Further, in step S310, when the liquid supply pipeline 140 stops supplying the liquid chemicals, the controller 210 of the liquid suck-back system can close a liquid supply valve of the liquid supply pipeline 140, and opens the suck-back valve 120, and the suck-back pump 110 starts to suck back the residual liquid chemicals in the liquid supply pipeline 140 and the suck-back pipeline 100.

Optionally, when the suck-back valve 120 is opened, the sensor 200 located outside the water return bay 190 detects the amount of liquid in the water return bay 190, and sends the detection signal obtained by detection to the controller 210.

Further, in step S420, when the suck-back valve 120 is opened, the first timer of the liquid suck-back system starts a first timing. If a first timing duration exceeds a first preset duration, the first preset duration may be 10-20 s, it is determined that the suck-back of the liquid suck-back system is abnormal, and the controller 210 closes the suck-back valve 120 to stop the suck-back.

Optionally, when it is determined that the suck-back of the liquid suck-back system is abnormal, the controller 210 controls the alarm of the liquid suck-back system to issue an alarm message.

Further, the sensor 200 includes the optical sensor 200, the detection signal includes the optical signal, and a process of detecting the amount of liquid in the water return bay 190 includes: transmitting, by a transmitting terminal of the optical sensor 200, the optical signal to a bottom of the water return bay 190, receiving, by a receiving terminal of the optical sensor 200, the optical signal passing through the water return bay 190, calculating the intensity of the optical signal, and sending information about the intensity of the optical signal to the controller 210.

Further, the controller 210 compares the received information about the intensity of the optical signal with the preset intensity, and when the intensity of the optical signal changes from being less than the preset intensity to being greater than the preset intensity, the second timer of the liquid suck-back system may be controlled to start a second timing. If a second timing duration exceeds a second preset duration, the second preset duration may be 2-5 s. The second timing is ended, it is determined that there are no residual liquid chemicals in the water return bay 190, and the suck-back valve 120 is closed to stop the suck-back.

Further, if the second timing duration does not exceed the second preset duration and the intensity of the optical signal changes from being greater than the preset intensity to being less than the preset intensity, the second timing is ended and reset, and the second timing is restarted the next time the intensity of the optical signal changes from being less than the preset intensity to being greater than the preset intensity.

In an embodiment of the present disclosure, when the suck-back valve 120 is opened, the pressure detection device of the liquid suck-back system detects the suck-back pressure in the suck-back pipeline, and sends information about the suck-back pressure to the controller 210. If the suck-back pressure is out of a preset pressure range, it is determined that the suck-back of the liquid suck-back system is abnormal, and the controller 210 closes the suck-back valve 120 to stop the suck-back. When it is determined that the suck-back of the liquid suck-back system is abnormal, the controller 210 controls the alarm of the liquid suck-back system to issue an alarm message.

Figure 4:
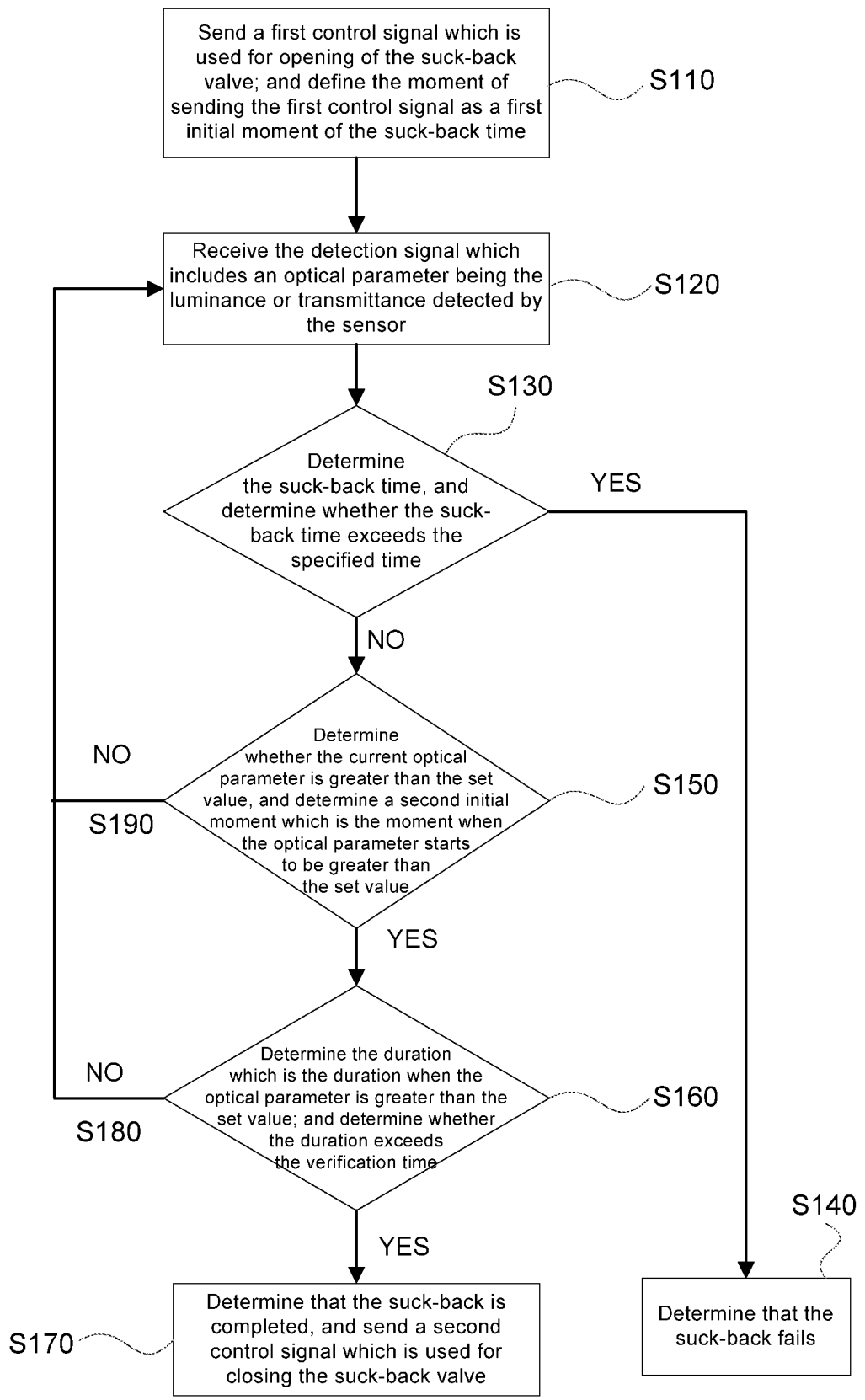
FIG. 4 is a flow chart of a liquid suck-back method according to another implementation of the present disclosure.

In an embodiment of the present disclosure, a liquid suck-back method is also provided. Referring to FIG. 4, the liquid suck-back method is applicable to the controller 210 and the sensor 200. The controller 210 is respectively set with a specified time, a verification time, and a set value. In some embodiments, the luminance or transmittance detected by the sensor 200 can be used as the set value. In the liquid suck-back method, whether there is liquid in the liquid supply pipeline 140 can be determined in real time, which may include the following steps.

Step S110, the controller 210 sends a first control signal which is used for opening the suck-back valve 120. The moment when the controller 210 sends the first control signal is defined as a first initial moment of the suck-back time.

Step S120, the controller 210 receives the detection signal. The detection signal includes an optical parameter, and the optical parameter is the luminance or transmittance detected by the sensor.

Step S130, the controller 210 determines the suck-back time, and the controller 210 determines whether the suck-back time exceeds the specified time.

Step S140, if the controller 210 determines that the suck-back time exceeds the specified time, the controller 210 determines that the suck-back fails. The controller 210 sends an alarm signal, and the alarm signal is used to cause the alarm 220 to issue an alarm.

Step S150, if the controller 210 determines that the suck-back time does not exceed the specified time, the controller 210 determines whether the current optical parameter is greater than the set value, and determines a second initial moment which is the moment when the optical parameter starts to be greater than the set value.

Step S160, if the controller 210 determines that the current optical parameter is greater than the set value, the duration is determined, which is the duration when the optical parameter is greater than the set value. Whether the duration exceeds the verification time is determined.

Step S170, if the controller 210 determines that the duration is greater than the verification time, the controller 210 determines that the suck-back is completed. The controller 210 sends a second control signal which is used for closing of the suck-back valve 120.

Step S180, if the controller 210 determines that the duration time is less than the verification time, the method jumps to step S120.

Step S190, if the controller 210 determines that the current optical parameter is not greater than the set value, the method jumps to step S120.

In an embodiment of the present disclosure, when the liquid in the single-chip washing and etching machine is being sucked back, the controller 210 in the liquid suck-back system needs to use the constant as the basis for determination, and then issues a corresponding response signal. Therefore, the controller 210 is internally set with constants, which are the specified time, the verification time, and the set value respectively. In an embodiment of the present disclosure, the luminance or transmittance of the sensor 200 can be used as the set value.

Optionally, in step S110, when the liquid suck-back is started, the controller 210 may send a first control signal, and may also send a third control signal and a fourth control signal. The suck-back valve 120 is opened in response to the first control signal, and the moment when the controller 210 sends the first control signal is defined as a first initial moment of the suck-back time. The liquid supply control valve 150 is closed in response to the third control signal, and the suck-back pump control valve 260 is opened in response to the fourth control signal.

Optionally, step S120 can be implemented by the following method.

The controller 210 receives the detection signal detected by the photosensitive sensor, and determines the current moment when the luminance data sent by the photosensitive sensor is received.

Optionally, in step S130, a process of determining the suck-back time by the controller 210 includes the following sub-steps.

The current data receiving moment is updated according to the moment of receiving the detection signal, and the controller 210 subtracts the first initial moment from the current moment of receiving the detection signal to obtain the suck-back time.

Optionally, step S150 further includes the following sub-steps.

A process of determining the second initial moment by the controller 210 includes the following sub-steps.

If the controller 210 determines that the current optical parameter is less than the set value, it is determined that the current second initial moment does not exist, the method jumps to step S120.

If the controller 210 determines that the current luminance is not less than the set value, and the current second initial moment does not exist, the current second initial moment is determined by the current moment of receiving the detection signal by the controller 210.

If the controller 210 determines that the current luminance is not less than the set value and the current second initial moment exists, the current second initial moment is not updated.

Optionally, in step S160, if the controller 210 determines that the current optical parameter is greater than the set value, a process of determining the duration when the optical parameter is greater than the set value may include the following sub-steps.

If the controller 210 determines that the current optical parameter is not less than the set value, the current moment of receiving the detection signal is determined according to the moment of receiving the detection signal, and the duration when the optical parameter is greater than the set value is the current moment of receiving the detection signal minus the second initial moment.

Figure 5:
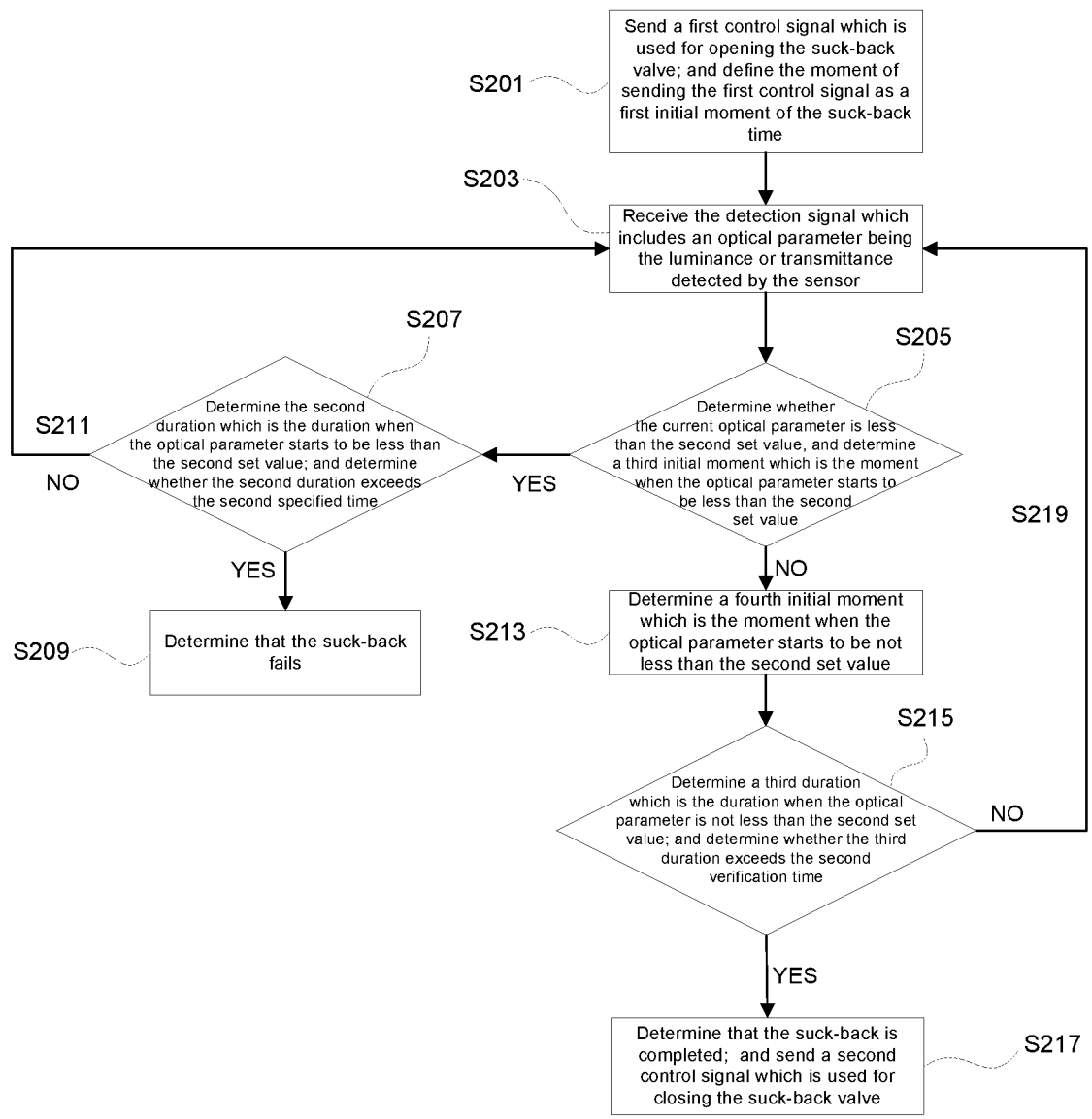
FIG. 5 is a flow chart of a liquid suck-back method according to an implementation of the present disclosure.

In another embodiment of the present disclosure, the present disclosure may further provide a liquid suck-back method. Referring to FIG. 5, the liquid suck-back method is applicable to the controller 210 and the sensor 200. The controller 210 is respectively set with a second specified time, a second verification time, and a second set value. In an embodiment of the present disclosure, the luminance or transmittance of the sensor 200 may be used as the second set value. In the liquid suck-back method, whether there is liquid in the liquid supply pipeline 140 can be determined in real time, which may include the following steps.

Step S201, the controller 210 sends a first control signal which is used for opening the suck-back valve 120. The moment of sending the first control signal is defined as a first initial moment of the suck-back time.

Step S203, the controller 210 receives the detection signal. The detection signal includes an optical parameter, and the optical parameter is the luminance or transmittance detected by the sensor 200.

Step S205, the controller 210 determines whether the current optical parameter is less than the second set value, and determines a third initial moment which is the moment when the optical parameter starts to be less than the second set value.

Step S207, if the controller 210 determines that the current optical parameter is less than the second set value, the second duration is determined, which is the duration when the optical parameter is less than the second set value. Whether the second duration exceeds the second specified time is determined.

Step S209, if the controller 210 determines that the second duration time is greater than the second specified time, the controller 210 determines that the suck-back fails.

Step S211, if the controller 210 determines that the second duration time does not exceed the second specified time, the method jumps to step S203.

Step S213, if the controller 210 determines that the current optical parameter is not less than the second set value, and a fourth initial moment is determined, which is the moment when the optical parameter starts to be not less than the second set value.

Step S215, the controller 210 determines that the current optical parameter is not less than the second set value, and determines a third duration which is the duration when the optical parameter is not less than the second set value. Whether the third duration exceeds the second verification time is determined.

Step S217, if the controller 210 determines that the third duration exceeds the second verification time, the controller 210 determines that the suck-back is completed. The controller 210 sends a second control signal which is used for closing the suck-back valve 120.

Step S219, if the controller 210 determines that the third duration does not exceed the second verification time, the method jumps to step S203.

In another embodiment of the present disclosure, when the liquid in the single-chip washing and etching machine is being sucked back, the controller 210 in the liquid suck-back system needs to use the constant as the basis for determination, and then issues a corresponding response signal. Therefore, the controller 210 is internally set with constants, which are the second specified time, the second verification time, and the second set value respectively. In an embodiment of the present disclosure, the optical parameter or transmittance of the sensor 200 can be used as the second set value.

Optionally, in step S201, when the liquid suck-back is started, the controller 210 may send a first control signal, and the suck-back valve 203 is opened in response to the first control signal. A third control signal and a fourth control signal may also be sent. The liquid supply control valve 150 is closed in response to the third control signal, and the suck-back pump control valve 260 is opened in response to the fourth control signal.

Optionally, step S203 can be implemented by the following method.

The controller 210 receives the optical parameter data detected by the photosensitive sensor, and determines the current moment when the optical parameter data sent by the photosensitive sensor is received.

Optionally, in step S205, the third initial moment is the moment when the optical parameter starts to be less than the second set value, and a process of determining the third initial moment includes the following sub-steps.

If the controller 210 determines that the current optical parameter is not less than the second set value, it is determined that the current second initial moment does not exist, the method jumps to step S203.

If the controller 210 determines that the current luminance is less than the second set value, and the current third initial moment does not exist, the current third initial moment is determined by the current moment of receiving the detection signal by the controller 210.

If the controller 210 determines that the current luminance is not less than the second set value and the current third initial moment exists, the current third initial moment is not updated.

Optionally, in step S207, if the controller 210 determines that the current optical parameter is less than the second set value, a process of determining the second duration when the current optical parameter is less than the second set value may include the following sub-steps.

If the controller 210 determines that the current optical parameter is less than the second set value, the current moment of receiving the detection signal is determined according to the moment of receiving the detection signal, and the second duration when the optical parameter is less than the second set value is the current moment of receiving the detection signal minus the third initial moment.

Optionally, in step S213, a process of determining the fourth initial moment includes the following sub-steps.

If the controller 210 determines that the current optical parameter is less than the second set value, it is determined that the current third initial moment does not exist, the method jumps to step S203.

If the controller 210 determines that the current luminance is not less than the second set value, and the current fourth initial moment does not exist, the current fourth initial moment is determined by the current moment of receiving the detection signal by the controller 210.

If the controller 210 determines that the current luminance is not less than the second set value and the current fourth initial moment exists, the current fourth initial moment is not updated.

Optionally, in step S215, if the controller 210 determines that the current optical parameter is greater than the second set value, a process of determining the third duration when the optical parameter is greater than the second set value may include the following sub-steps.

If the controller 210 determines that the current optical parameter is greater than the second set value, the current moment of receiving the detection signal is determined according to the moment of receiving the detection signal, and the third duration when the optical parameter is greater than the second set value is the current moment of receiving the detection signal minus the fourth initial moment.

It should be noted that although the steps of the method in the present disclosure are described in the accompanying drawings in a particular sequence, it is not required or implied that the steps must be performed in that particular sequence or that all of the steps shown must be performed to achieve the desired results. Additionally or alternatively, some steps may be omitted, a plurality of steps may be combined into a single step for execution, and/or a single step may be divided into a plurality of steps for execution, which shall be regarded as part of the present disclosure.

It should be understood that the present disclosure does not limit its application to the detailed structure and arrangement of components set forth in this specification. The present disclosure can have other implementations and can be implemented and executed in various ways. Variations and modifications of the foregoing fall within the scope of the present disclosure. It will be understood that the disclosure disclosed and defined in this specification extends to all alternative combinations of two or more individual features mentioned or apparent in the text and/or drawings. All of these different combinations constitute various alternative aspects of the present disclosure. The implementations of this specification illustrate the best mode known for implementing the present disclosure, and will enable any person skilled in the art to make use of the present disclosure.

The invention claimed is:

1. A liquid suck-back system, comprising:
   a suck-back pipeline, wherein the suck-back pipeline comprises a first port and a second port, the first port is connected to the suck-back pump, and the second port is connected to a liquid supply pipeline; and
   a suck-back pump, wherein the suck-back pipeline comprises a suck-back valve and a water return bay, the liquid supply pipeline is configured to supply liquid chemicals, and the suck-back pump is configured to suck back residual liquid chemicals in the liquid supply pipeline when the liquid supply pipeline stops supplying liquid chemicals;
   a controller, wherein the controller is configured to control opening and closing of the suck-back valve;
   a sensor located outside the water return bay, wherein the sensor is connected to the controller, and configured to detect an amount of liquid in the water return bay and send a detection signal to the controller;
   a first timer, wherein the first timer is connected to the controller, and configured to calculate a first duration and send information about the first duration to the controller, and the first duration comprises a duration of the detection signal in a first state.

2. The liquid suck-back system according to claim 1, wherein the sensor comprises an optical sensor, the detection signal comprises an optical signal, and the duration of the detection signal in the first state comprises a duration when an intensity of the optical signal is greater than a preset intensity.

3. A liquid suck-back method comprising: providing the liquid suck-back system of claim 1, opening the suck-back valve when the liquid supply pipeline stops supplying the liquid chemicals, and sucking back the residual liquid chemicals in the liquid supply pipeline and the suck-back pipeline by the suck-back pump; and when there are no residual liquid chemicals in the water return bay or when suck-back is abnormal, closing the suck-back valve to stop the suck-back; when the liquid supply pipeline stops supplying the liquid chemicals, the controller of the liquid suck-back system closes a liquid supply valve of the liquid supply pipeline, and opens the suck-back valve, and the suck-back pump starts to suck back the residual liquid chemicals in the liquid supply pipeline and the suck-back pipeline; when the suck-back valve is opened, the first timer of the liquid suck-back system starts a first timing; and when a first timing duration exceeds a first preset duration, it is determined that the suck-back of the liquid suck-back system is abnormal, and the controller closes the suck-back valve to stop the suck-back.

4. The liquid suck-back method according to claim 3, wherein when the suck-back valve is opened, the sensor located outside the water return bay detects an amount of liquid in the water return bay, and sends a detection signal obtained by the detection to the controller.

5. The liquid suck-back method according to claim 4, wherein the sensor comprises an optical sensor, the detection signal comprises an optical signal, and a process of detecting the amount of liquid in the water return bay comprises: transmitting, by a transmitting terminal of the optical sensor, the optical signal to a bottom of the water return bay, receiving, by a receiving terminal of the optical sensor, the optical signal passing through the water return bay, calculating an intensity of the optical signal, and sending information about the intensity of the optical signal to the controller.

6. The liquid suck-back method according to claim 5, wherein the controller compares the received information about the intensity of the optical signal with a preset intensity, and when the intensity of the optical signal changes from being less than the preset intensity to being greater than the preset intensity, a second timer of the liquid suck-back system is controlled to start a second timing; and
   when a second timing duration exceeds a second preset duration, the second timing is ended, it is determined that there are no residual liquid chemicals in the water return bay, and the suck-back valve is closed to stop the suck-back.

7. The liquid suck-back method according to claim 6, wherein when the second timing duration does not exceed the second preset duration and the intensity of the optical signal changes from being greater than the preset intensity to being less than the preset intensity, the second timing is ended and reset, and the second timing is restarted the next time when the intensity of the optical signal changes from being less than the preset intensity to being greater than the preset intensity.

8. The liquid suck-back method according to claim 3, wherein when the suck-back valve is opened, a pressure detection device of the liquid suck-back system detects a suck-back pressure in the suck-back pipeline, and sends information about the suck-back pressure to the controller; and when the suck-back pressure is out of a preset pressure range, it is determined that the suck-back of the liquid suck-back system is abnormal, and the controller closes the suck-back valve to stop the suck-back.

9. The liquid suck-back method according to claim 8, wherein when it is determined that the suck-back of the liquid suck-back system is abnormal, the controller controls an alarm of the liquid suck-back system to issue an alarm message.

10. The liquid suck-back method according to claim 3, wherein when it is determined that the suck-back of the liquid suck-back system is abnormal, the controller controls an alarm of the liquid suck-back system to issue an alarm message.

11. A liquid suck-back system, comprising:

a suck-back pipeline, wherein the suck-back pipeline comprises a first port and a second port, the first port is connected to the suck-back pump, and the second port is connected to a liquid supply pipeline; and a suck-back pump, wherein the suck-back pipeline comprises a suck-back valve and a water return bay, the liquid supply pipeline is configured to supply liquid chemicals, and the suck-back pump is configured to suck back residual liquid chemicals in the liquid supply pipeline when the liquid supply pipeline stops supplying liquid chemicals;

a controller, wherein the controller is configured to control opening and closing of the suck-back valve;

a second timer, wherein the second timer is connected to the controller, and configured to calculate a second duration and send information about the second duration to the controller, and the second duration comprises a suck-back duration when the suck-back valve is in an open state;

a pressure detection device, wherein the pressure detection device is connected to the controller, and configured to detect a suck-back pressure in the suck-back pipeline when the suck-back valve is in the open state and send information about the suck-back pressure to the controller;

an alarm, wherein the alarm is connected to the controller, and configured to issue an alarm prompt message during suck-back abnormality; and the suck-back abnormality comprises the suck-back duration being longer than a first preset duration or the suck-back pressure being out of a preset pressure range.

* * * * *